US011901248B2

(12) United States Patent
Sankman et al.

(10) Patent No.: US 11,901,248 B2
(45) Date of Patent: Feb. 13, 2024

(54) EMBEDDED DIE ARCHITECTURE AND METHOD OF MAKING

(71) Applicant: Intel Corporation, Santa Clara, CA (US)

(72) Inventors: Robert L. Sankman, Phoenix, AZ (US); Rahul N. Manepalli, Chandler, AZ (US); Robert Alan May, Chandler, AZ (US); Srinivas Venkata Ramanuja Pietambaram, Chandler, AZ (US); Bharat P. Penmecha, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 774 days.

(21) Appl. No.: 16/832,851

(22) Filed: Mar. 27, 2020

(65) Prior Publication Data
US 2021/0305108 A1 Sep. 30, 2021

(51) Int. Cl.
| | |
|---|---|
| *H01L 23/15* | (2006.01) |
| *H01L 25/065* | (2023.01) |
| *H01L 21/48* | (2006.01) |
| *H01L 23/538* | (2006.01) |
| *H01L 23/31* | (2006.01) |

(52) U.S. Cl.
CPC ............ *H01L 23/15* (2013.01); *H01L 21/486* (2013.01); *H01L 23/3128* (2013.01); *H01L 23/5381* (2013.01); *H01L 23/5384* (2013.01); *H01L 25/0655* (2013.01)

(58) Field of Classification Search
CPC ..................................................... H01L 23/15
See application file for complete search history.

(56) References Cited

U.S. PATENT DOCUMENTS

| | | | |
|---|---|---|---|
| 10,593,628 B2 * | 3/2020 | Bhagavat | H01L 23/49838 |
| 11,569,172 B2 | 1/2023 | Hou et al. | |
| 2014/0321803 A1 | 10/2014 | Thacker et al. | |
| 2015/0228583 A1 | 8/2015 | Karhade et al. | |
| 2019/0206798 A1 | 7/2019 | Collins et al. | |
| 2019/0279936 A1 | 9/2019 | Lin et al. | |
| 2019/0341320 A1 * | 11/2019 | Pollard | H01L 21/561 |
| 2020/0135604 A1 * | 4/2020 | Yen | H01L 21/4846 |
| 2021/0005556 A1 | 1/2021 | Yu et al. | |
| 2021/0050327 A1 | 2/2021 | Shih | |
| 2021/0118758 A1 | 4/2021 | Cheng et al. | |
| 2021/0118770 A1 | 4/2021 | Kuo et al. | |

(Continued)

FOREIGN PATENT DOCUMENTS

| | | |
|---|---|---|
| CN | 113097199 A | 7/2021 |
| DE | 102020130872 A1 | 6/2021 |

(Continued)

*Primary Examiner* — Selim U Ahmed
*Assistant Examiner* — Evan G Clinton
(74) *Attorney, Agent, or Firm* — Akona IP PC (57) ABSTRACT

Various examples provide a semiconductor patch. The patch includes a glass core having first and second opposed major surfaces extending in an x-y direction. The patch further includes a conductive via extending from the first major surface to the second major surface substantially in a z-direction. The patch further includes a bridge die embedded in a dielectric material in communication with the conductive via. The patch further includes an overmold at least partially encasing the glass core.

20 Claims, 6 Drawing Sheets

(56) References Cited

U.S. PATENT DOCUMENTS

| | | | |
|---|---|---|---|
| 2021/0193579 A1 | 6/2021 | Ganesan et al. | |
| 2021/0193637 A1* | 6/2021 | Jeng | H01L 23/5384 |

FOREIGN PATENT DOCUMENTS

| | | | | |
|---|---|---|---|---|
| JP | 2021100099 A | 7/2021 | | |
| KR | 100852766 B1 | 8/2008 | | |
| TW | 202139402 A | 10/2021 | | |
| WO | 2017111957 A1 | 6/2017 | | |
| WO | WO-2017111957 A1 * | 6/2017 | ......... | H01L 21/4853 |
| WO | 2019132965 A1 | 7/2019 | | |

* cited by examiner

EMBEDDED DIE ARCHITECTURE AND METHOD OF MAKING

BACKGROUND

Microelectronics typically include a central processing unit (CPU). To enhance performance, CPU products are increasingly integrating multi-die into CPU packages in the form of side-by-side or other multi-chip modules (MCMs). Embedded Multi-die Interconnect Bridging (EMIB) is one way to electrically connect multiple dies within a microelectronic package.

BRIEF DESCRIPTION OF FIGURES

The drawings illustrate generally, by way of example, but not by way of limitation, various examples of the present invention.

DETAILED DESCRIPTION OF THE INVENTION

Reference will now be made in detail to certain examples of the disclosed subject matter, examples of which are illustrated in part in the accompanying drawings. While the disclosed subject matter will be described in conjunction with the enumerated claims, it will be understood that the exemplified subject matter is not intended to limit the claims to the disclosed subject matter.

Throughout this document, values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range. The statement "about X to Y" has the same meaning as "about X to about Y," unless indicated otherwise. Likewise, the statement "about X, Y, or about Z" has the same meaning as "about X, about Y, or about Z," unless indicated otherwise.

In this document, the terms "a," "an," or "the" are used to include one or more than one unless the context clearly dictates otherwise. The term "or" is used to refer to a nonexclusive "or" unless otherwise indicated. The statement "at least one of A and B" or "at least one of A or B" has the same meaning as "A, B, or A and B." In addition, it is to be understood that the phraseology or terminology employed herein, and not otherwise defined, is for the purpose of description only and not of limitation. Any use of section headings is intended to aid reading of the document and is not to be interpreted as limiting; information that is relevant to a section heading may occur within or outside of that particular section.

In the methods described herein, the acts can be carried out in any order without departing from the principles of the invention, except when a temporal or operational sequence is explicitly recited. Furthermore, specified acts can be carried out concurrently unless explicit claim language recites that they be carried out separately. For example, a claimed act of doing X and a claimed act of doing Y can be conducted simultaneously within a single operation, and the resulting process will fall within the literal scope of the claimed process.

The term "about" as used herein can allow for a degree of variability in a value or range, for example, within 10%, within 5%, or within 1% of a stated value or of a stated limit of a range, and includes the exact stated value or range. The term "substantially" as used herein refers to a majority of, or mostly, as in at least about 50%, 60%, 70%, 80%, 90%, 95%, 96%, 97%, 98%, 99%, 99.5%, 99.9%, 99.99%, or at least about 99.999% or more, or 100%. The term "substantially free of" as used herein can mean having none or having a trivial amount of, such that the amount of material present does not affect the material properties of the composition including the material, such that about 0 wt % to about 5 wt % of the composition is the material, or about 0 wt % to about 1 wt %, or about 5 wt % or less, or less than, equal to, or greater than about 4.5 wt %, 4, 3.5, 3, 2.5, 2, 1.5, 1, 0.9, 0.8, 0.7, 0.6, 0.5, 0.4, 0.3, 0.2, 0.1, 0.01, or about wt % or less, or about 0 wt %.

Figure 1:
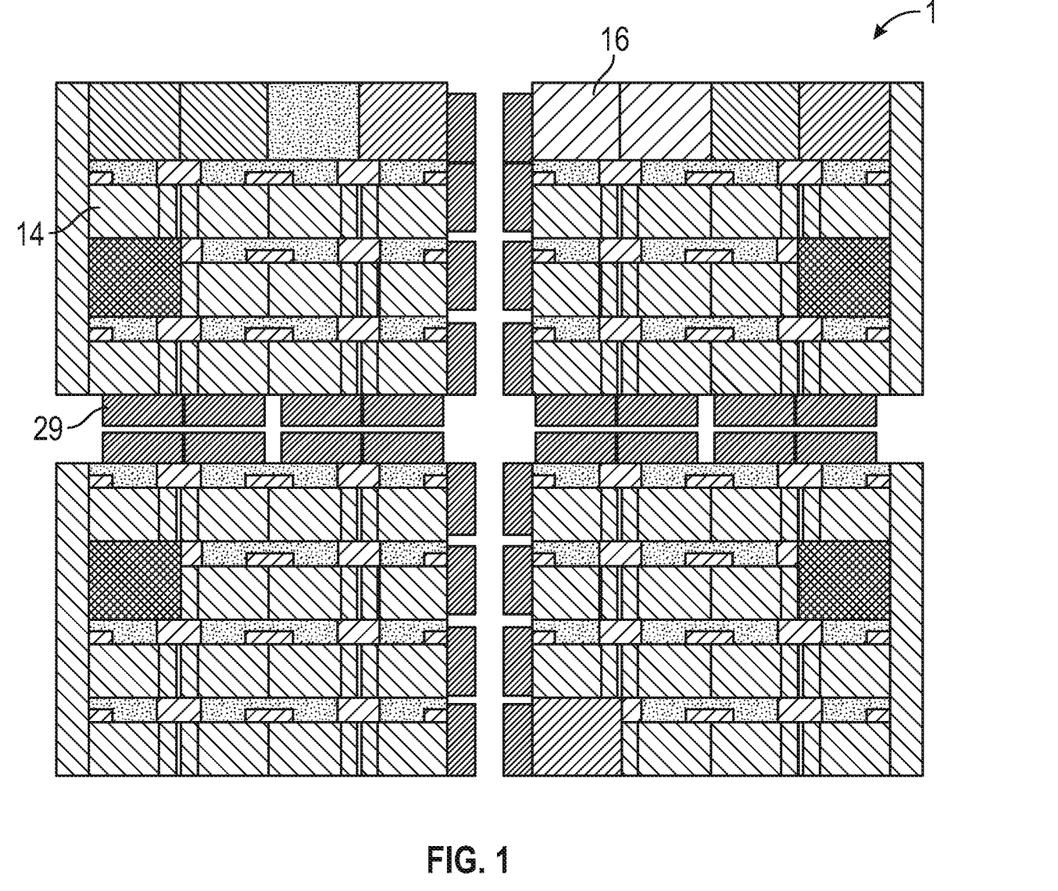
FIG. 1 is a schematic view of a multi-chip module semiconductor package assembly, in accordance with various examples.
Figure 2:
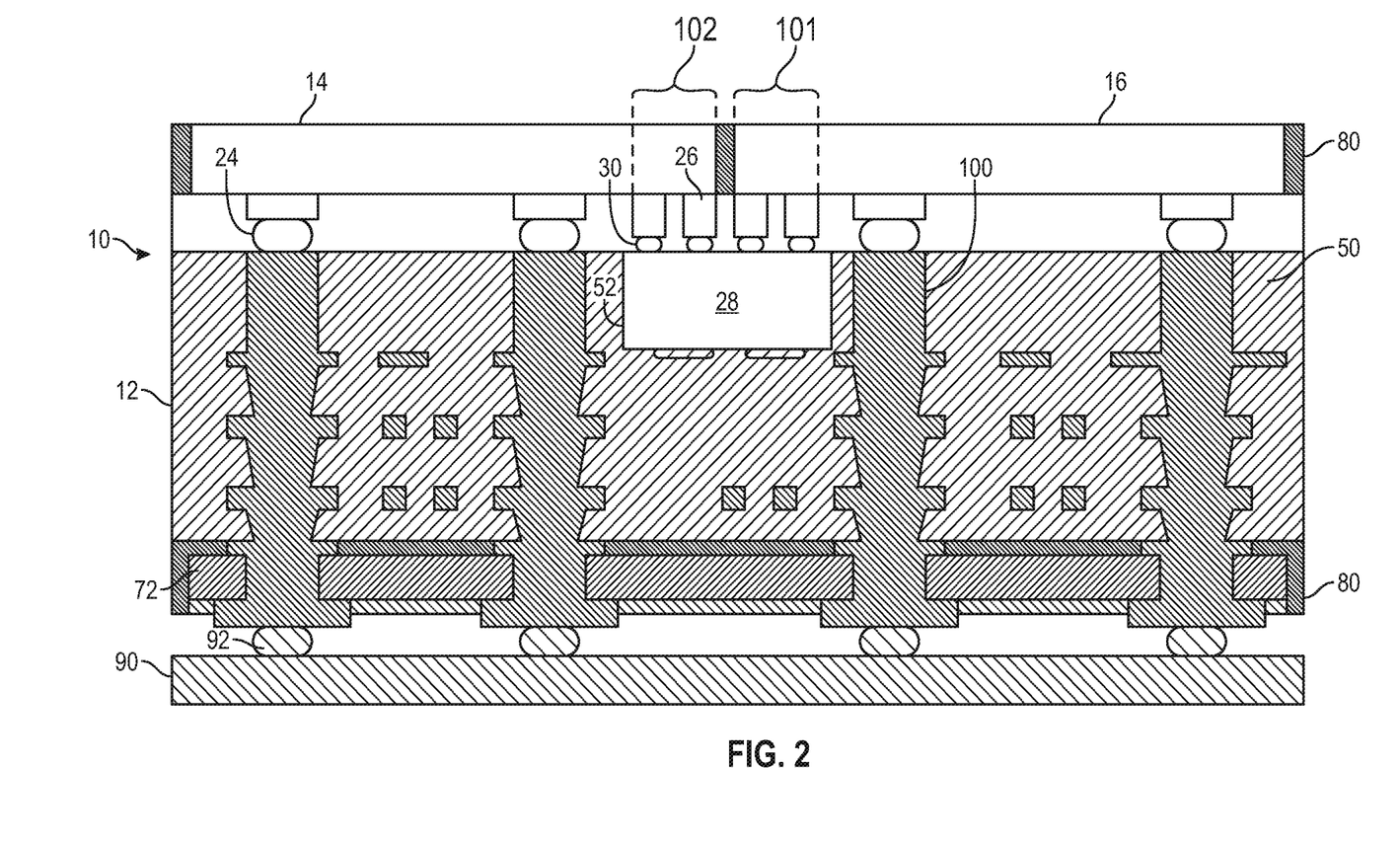
FIG. 2 is sectional view of a semiconductor package assembly, in accordance with various examples.

FIG. 1 is a schematic view of a multi-chip module semiconductor package assembly 1. Assembly 1 includes a number of dies (e.g., dies 14 and 16 that are joined and electronically connected to each other using a bridge located at bridge region 29 as described in one or more examples below. FIG. 2 shows one example of a bridge coupled over a bridge region in a package assembly.

FIG. 2 is a cross-sectional diagram of a semiconductor package using a bridge. In one example, the package 10 is formed from a substrate 12 that is connected to a bridge (e.g., a bridge die) 28, which serves as a communication pathway for the functional surface dies 14 and 16. Although a bridge formed from a semiconductor die is shown, other bridge configurations, including, but not limited to organic bridges, are within the scope of the invention. Although not shown, a cover can encase substrate 12 and dies 14 and 16. A cooling solution such as cooling fins can also be attached to the top of the cover. A variety of different cooling solutions may be used such as conductive plates, integrated heat spreaders, liquid cooling, heat pipes, or radiative fins as shown depending on the particular example. Alternatively, the device may be fabricated without the cooling solution and even without a cover.

Package 10 can be coupled to an interposer 90, which is connected to substrate 12 by solder balls 92 or other connector configurations. Interposer 90 can connect to a plurality of packages 10. Interposer 90 can further be used to provide power to substrate 12 by connecting to through package vias 70. Although element 90 is an interposer in the example of FIG. 2, the invention is not so limited. Other substrates, or circuit board levels may be used instead of an interposer.

Device substrate 12 can include internal high density interconnect routing for communicating between surface dies 14 and 16. Substrate 12 may include embedded components of a semiconductor material (e.g., a silicon, gallium, indium, germanium, or variations or combinations thereof) and one or more insulating layers, such as organic based build up film, glass-reinforced epoxy, such as FR-4, polytetrafluorethylene (Teflon), cotton-paper reinforced epoxy (CEM-3), phenolic-glass (G3), paper-phenolic (FR-1 or FR-2), polyester-glass (CEM-5), or any other dielectric layer, that can be used in printed circuit boards (PCBs). Substrate 12 can be made using an embedded die buildup layer process or other technique. An embedded die buildup layer process includes one or more build-up layers formed around an element, such as a high density interconnect element or bridge 28 or die 14, 16. A micro via formation process, such as laser drilling, can form connections between build-up layers and die bond pads. The build-up layers may be formed using a high-density integration patterning technology.

Package 10 can further include core 72. Core 72 can serve to reduce a mismatch in the coefficient of thermal expansion of various components of package 10. Core 72 furthermore, can be helpful to reinforce package 10. Core 72 can include many suitable materials or mixture of materials. For example, core 72 can include a glass such as a soda-lime glass, borosilicate glass, alumino-silicate glass, alkali-borosilicate glass, aluminoborosilcate glass, an alkalialuminosilicate glass, or a mixture thereof. The glass can be a monolithic glass or a glass laminate including a plurality of layers. A thickness of core 72 can be in a range of from about 250 microns to about 2 mm, about 400 microns to about 500 microns, less than, equal to, or greater than about 300 microns, 350 microns, 400 microns, 450 microns, 500 microns, 550 microns, 600 microns, 650 microns, 700 microns, 800 microns, 900 microns, 1 mm, 1.2 mm, 1.3 mm, 1.4 mm, 1.5 mm, 1.6 mm, 1.7 mm, 1.8 mm, 1.9 mm, or about 2 mm. Through core vias 70 can extend through core 72 in the z-direction. Core 72 can help to reduce the mismatch in the coefficient of thermal expansion between substrate 12 and interposer 90. This can help to reduce the degree of warpage found in package 10. A coefficient of thermal expansion in core 72 can be in a range of from about 3 to about 12, about 5 to about 8, less than, equal to, or greater than about 3, 4, 5, 6, 7, 8, 9, 10, 11, or about 12. Overmold material 80 at least partially encases core 72. In some examples, overmold material 80 can fully encase core 72. Overmold 80 can extend over core 72 in examples where there is no need to cut core 72 to allow components to extend therethrough.

Dies or electronic components 14 and 16 can be many types of dies or electronic components. In one example, dies or electronic components 14 and 16 can be part of a multi-die component package, a silicon die, a resistor, a capacitor, or an inductor. In some examples, dies 14 or 16 can be a central processing unit, a flash memory, a wireless charger, a power management integrated circuit (PMIC), a Wi-Fi transmitter, a global positioning system, an application specific integrated circuit, or a NAND memory stack. In a further example, die 14 or 16 can be a memory die and die 16 can be a central processing unit (CPU) die. In other examples both dies 14 and 16 can be memory dies or CPU dies. Dies 14 and 16 are coupled through C4 bumps 24 and vias 26 to a power source or bus. Although C4 bumps are used as an example, other connection structures are within the scope of the invention. While only one C4 bump 24 is shown for each die, 14, 16 coupled to a single via 26, there may be many connection points for each die 14, 16 coupled through many vias 26 to connect the dies with the device and to external circuitry. The overall package 10 may be connected directly to a printed circuit board (PCB) or coupled to a socket that is attached to some other device such as another (PCB). In one example, the interposer 90 may be connected directly to a printed circuit board (PCB) or coupled to a socket that is attached to some other device such as another (PCB).

Dies 14 and 16 can include a high density interconnect pad, such as can be used for power, ground, or other electrical coupling. A high density interconnect pad can be electrically coupled, such as through high density interconnect element 26, to a bus such as a power, ground, or data bus. The high density interconnect pad can also be electrically coupled to an electrically conductive pad, such as through conductive adhesive (not shown). The conductive adhesive can be solder (e.g., solder paste), electroplating, or microball, such as a microball configured for flip device interconnect (e.g., controlled collapse device connection (C4) interconnect).

As shown, bridge die 28 is embedded within a cavity of substrate 12. Bridge die 28 can also be known as an interconnect bridge. In one example, bridge die 28 is made of silicon and has a silica or silicon nitride surface. Bridge die 28 connects to CPU die 16 and memory die 14 through bumps 30.

As noted above, dies 14, 16 can include several types of dies. In the following description, as one example, die 16 will be referred to as a CPU die, and die 14 will be referred to as a memory 14. In one example, as shown in FIG. 2, CPU die 16 has first interconnect area 101 closest to memory 14 for connecting through the embedded bridge die 28 to memory 14. CPU 16 has second interconnect area 102 for connecting with external vias 100 for power and external data input and output. Second interconnect area may be divided into power interconnect areas and data interconnect areas. In some further examples, bridge die 28 can be one of a plurality of bridge dies 28. In some of these examples, bridge die 28 may only be directly coupled to one of dies 14 or 16.

Bridge die 28 includes electronic bumps 30 at least partially on or in a top surface of bridge die 28. The electrically conductive pads can include conductive metal, such as copper, gold, silver, aluminum, zinc, nickel, brass, bronze, iron, and the like.

Substrate 12 and core 72 include through build-up vias 70 and through core vias 100. Build-up vias 70 and through core vias 100 extend in the z-direction from core 72 and through substrate 12. Build-up vias 70 and through core vias 100 can include any electronically conductive material such as copper. Build-up vias 70 and through core vias 100 can be shaped to have a substantially circular or polygonal profile. Examples of substantially circular profiles can include a circular or elliptical profile. Examples of polygonal profiles can include a substantially quadrilateral, pentagonal, hexagonal, heptagonal profile or any other higher order polygonal profile. Build-up vias 70 and through core vias 100 can have a substantially constant cross-sectional shape or it can vary such that build-up vias 70 and through core vias 100 have a tapered or curved profile. The core via tapered profile can conform to an hour-glass shape.

As a result of extending through substrate 12, through vias 70 have a non 1:1 aspect ratio.

In one example, dielectric layer 50 can be formed over bridge die 28 and substrate 12. Dielectric layer 50 allows for dimensional variations in the placement and embedding of the bridge and electrically isolates all of the interconnection areas. Dielectric layer 50 can be formed from an epoxy-based resin such as bisphenol A, epoxy resin, a bisphenol F epoxy resin, a novolac epoxy resin, an aliphatic epoxy resin, a glycidylamine epoxy resin, and a glycidylamine epoxy resin, or any other resin including one or more terminal epoxy groups. In some examples dielectric layer 50 includes one layer having a thickness ranging from about 5 microns to about microns or about 15 microns to 45 microns, or from 20 microns to 35 microns or about 30, or less than, equal to, or greater than about 15 microns, 20 microns, 25 microns, 30 microns, 35 microns, 40, microns, or 45 microns.

A surface of dielectric layer 50 and a surface of bridge die 28 are joined at interface 52. As stated herein, dielectric layer 50 can be formed from an epoxy based resin and bridge die 28 can be formed from silicon and have a silica surface. Thus, interface 52 can be formed from two dissimilar materials. In order to adhere dielectric layer 50 and bridge die 28, an adhesion promotor layer can be applied to interface 52. The interface can include an adhesion promotor layer that can be formed from a plurality of silane based adhesion promotor molecules that include a silicon atom bonded to an organic group and three hydroxyl groups.

In some examples of the present invention dielectric layer 50 can be formed from multiple layers of material. For example, dielectric layer 50 can be formed from a base layer of epoxy resin or other dielectric layer as described above and further can include a second layer of epoxy-based resin that is bonded to the base layer. The second layer of epoxy based resin can have a thickness ranging from about 1 micron to about 5 microns, or about 2 microns to about 4 microns, or less than, equal to, or greater than about 1.2 microns, 1.4 microns, 1.6 microns, 1.8 microns, 2.0 microns, 2.2 microns, 2.4 microns, 2.6 microns, 2.8 microns, 3.0 microns, 3.2 microns, 3.4 microns, 3.6 microns, 3.8 microns, 4 microns, 4.2 microns, 4.4 microns, 4.6 microns, or 4.8 microns. In some examples, the adhesion promoting molecules can be bonded to the second layer of epoxy-based resin prior to lamination of dielectric layer 50 onto bridge die 28. In this manner the second layer of epoxy-based resin serves as a primer layer for adhesion between dielectric layer 50 and bridge die 28.

Semiconductor package 10 can be formed according to any suitable method. As an example of a suitable method, core layer 72 can be formed by placing a glass on a carrier. A plurality holes can be formed in core layer 72 by laser etching. Through core vias 100 can be grown in the holes. In another example, a seed layer of a sputtered copper layer can be disposed on a substrate. Glass units can be placed over the seed layer and through vias can be grown in the holes. After core layer 72 is formed, an overmold material 80 can be placed at least partially around core layer 72.

Through core vias 100 can be grown vertically to a desired length in the holes. Portions of the through core vias 100 extending from core 72 can be encased in a dielectric material, which can be planarized to expose the top portion of through core vias 100. The build-up vias 70 and redistribution layers can be formed using a traditional Semi-Additive Process (SAP) and solder balls 92 can be grown thereon. A portion of the dielectric material can be etched away and bridge die 28 can be placed in the etched portion. Dies 14 and 16 can then be attached to solder balls 24 and 30.

The assembly can then be at least partially encased in an overmold material 80 and optional elements such as a heat spreader can be attached to the mold.

Figure 3:
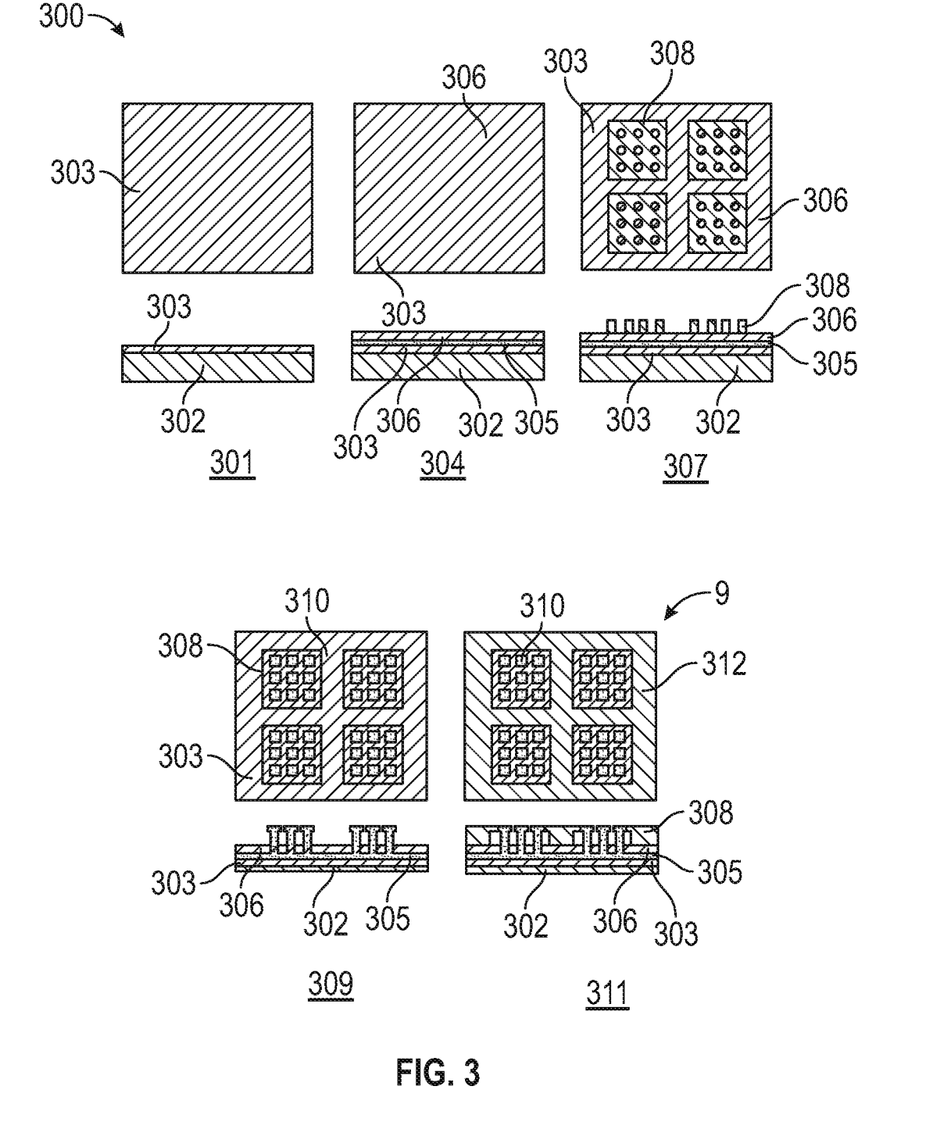
FIG. 3 is a schematic diagram showing a process for forming a portion of semiconductor package assembly, in accordance with various examples.

An example of a fabrication method of a precursor 9 of package 10 is shown in FIG. 3. FIG. 3 shows a variety of operations of method 300. Each operation shows a top view and side view of the assembly formed. As shown at operation 301, glass carrier 302 is laminated with temporary release layer 303. At operation 304, a conductive seed layer 305, one example of which in a method of the instant disclosure includes a sputtered TiCu, is deposited and an adhesive layer 306 is disposed over the seed layer 305. At operation 307 glass units 308 formed separately in a process not shown, are placed on the adhesive. Openings can be formed by being drilled in the glass units 308. At operation 309 adhesive layer 306 is removed from the drilled openings, for example, by plasma etching and vias 310 are formed from seed layer 305, for example, by electroplating, electroless plating, or another suitable method. At operation 311, overmold 312 is applied and polished to expose vias 310 for further buildup. The resulting structure in operation 311 is one example of a precursor 9 to package 10, as shown in FIG. 2.

Figure 4:
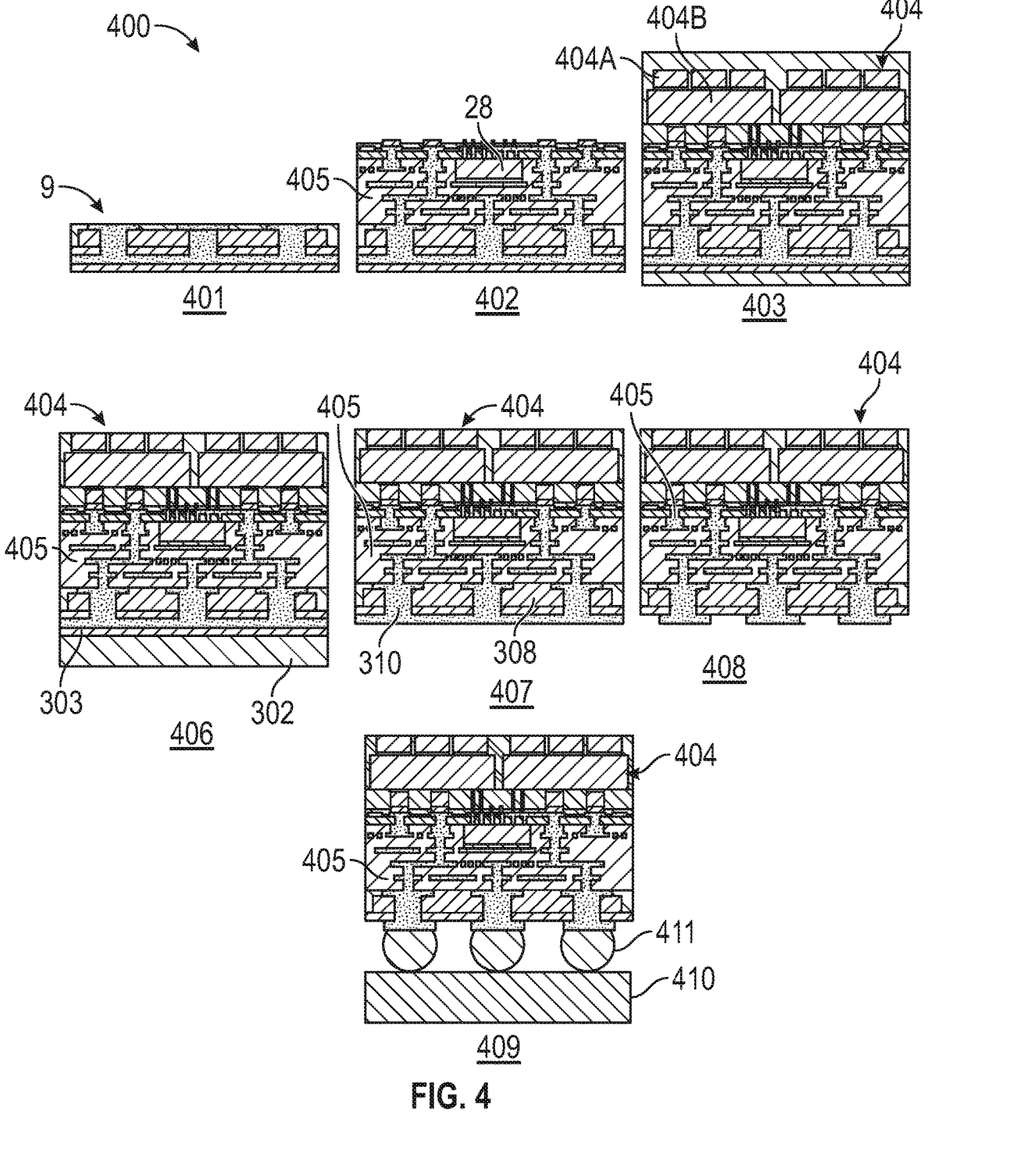
FIG. 4 is a schematic diagram showing a process for forming a semiconductor package assembly, in accordance with various examples.

The precursor 9 to package 10 can be formed into the final semiconductor package 10 according to method 400 as shown in FIG. 4. At operation 401 the precursor 9 of package 10 formed from method 300 is provided. At operation 402 various conductive layer and dielectric layers are formed through a re-distribution layer (RDL) process to form a substrate 405 with bridge die 28 embedded therein. At operation 403 die complex 404 is attached. Die complex 404 can include individual dies that are in communication with bridge die 28 or can include multiple dies that bridge between further dies. One example of a die complex, as shown in operation 403, includes three smaller dies 404A coupled to a main die 404B. Although three smaller dies 404A and one main die 404B are shown, the invention is not so limited. Other examples may include larger or smaller numbers of die combinations. At operation 406 the top of die complex 404 is ground to expose the top of the smaller dies 404A. At operation 407, glass carrier 302 and temporary release layer 303 are removed from the precursor to package 10. At operation 408 the seed layer 305 is removed, or patterned and partially removed to separate the vias 308. MLI pads are formed on vias 310 using a lithography process for pad formation followed by micro-ball bumping formation of solder balls 411. At operation 409, interposer 410 is attached to vias 310 by solder balls 411. Although element 410 is an interposer in the example of FIG. 4, the invention is not so limited. Other substrates, or circuit board levels may be used instead of an interposer.

Figure 5:
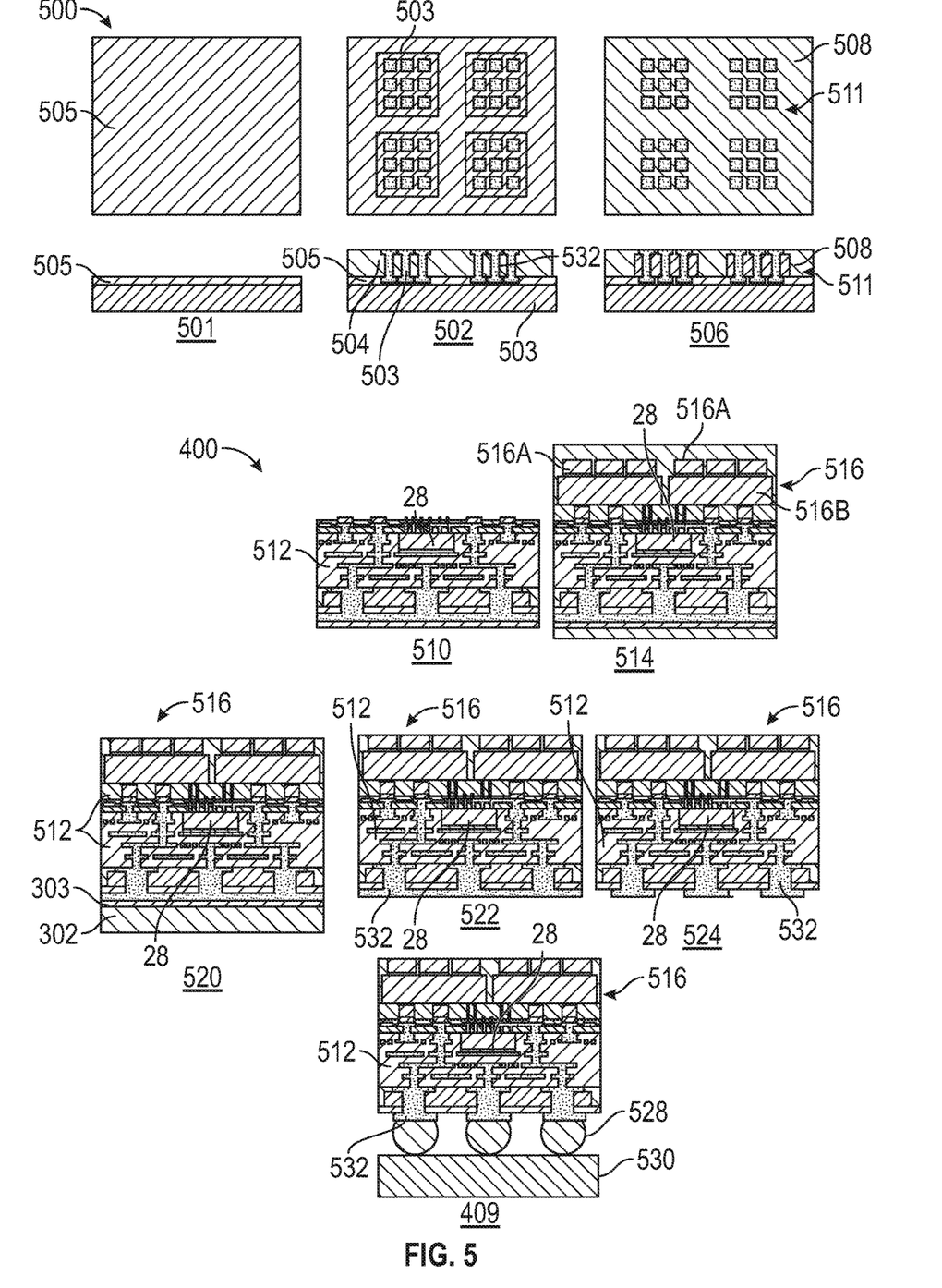
FIG. 5 is a schematic diagram showing a process for forming a semiconductor package assembly, in accordance with various examples.

FIG. 5 shows a further process 500 for forming semiconductor package similar to package 10 as shown in FIG. 2. In FIG. 5, operation 501 includes providing laminated glass carrier 505 similar to operation 301 in method 300. At operation 502, one or more glass units 503 including vias 532 surrounded in glass 504 are placed on carrier 505. At operation 506 an overmold 508 is applied to glass units 503 to form precursor 511. At operation 510, operation 400 is performed such that various conductive layer and dielectric layers are formed through re-distribution layer process to form a substrate 512 with bridge die 28 embedded therein. At operation 514 die complex 516 is attached. Similar to the example of FIG. 4, die complex 516 can include individual dies (516A and 516B) that are in communication with bridge die 28 or can include multiple dies. At operation 520 the top of die complex 516 is ground to expose the top of the die complex 516. At operation 522, glass carrier 302 and temporary release layer 303 are removed from the precursor 511 to package 10. At operation 524 a seed layer is removed, or patterned and partially removed to separate vias 532. MLI pads are formed on vias 532 using a lithography process for pad formation followed by micro-ball bumping formation of solder balls 528. At operation 526, interposer 530 is attached to vias 532 by solder balls 528.

Figure 6:
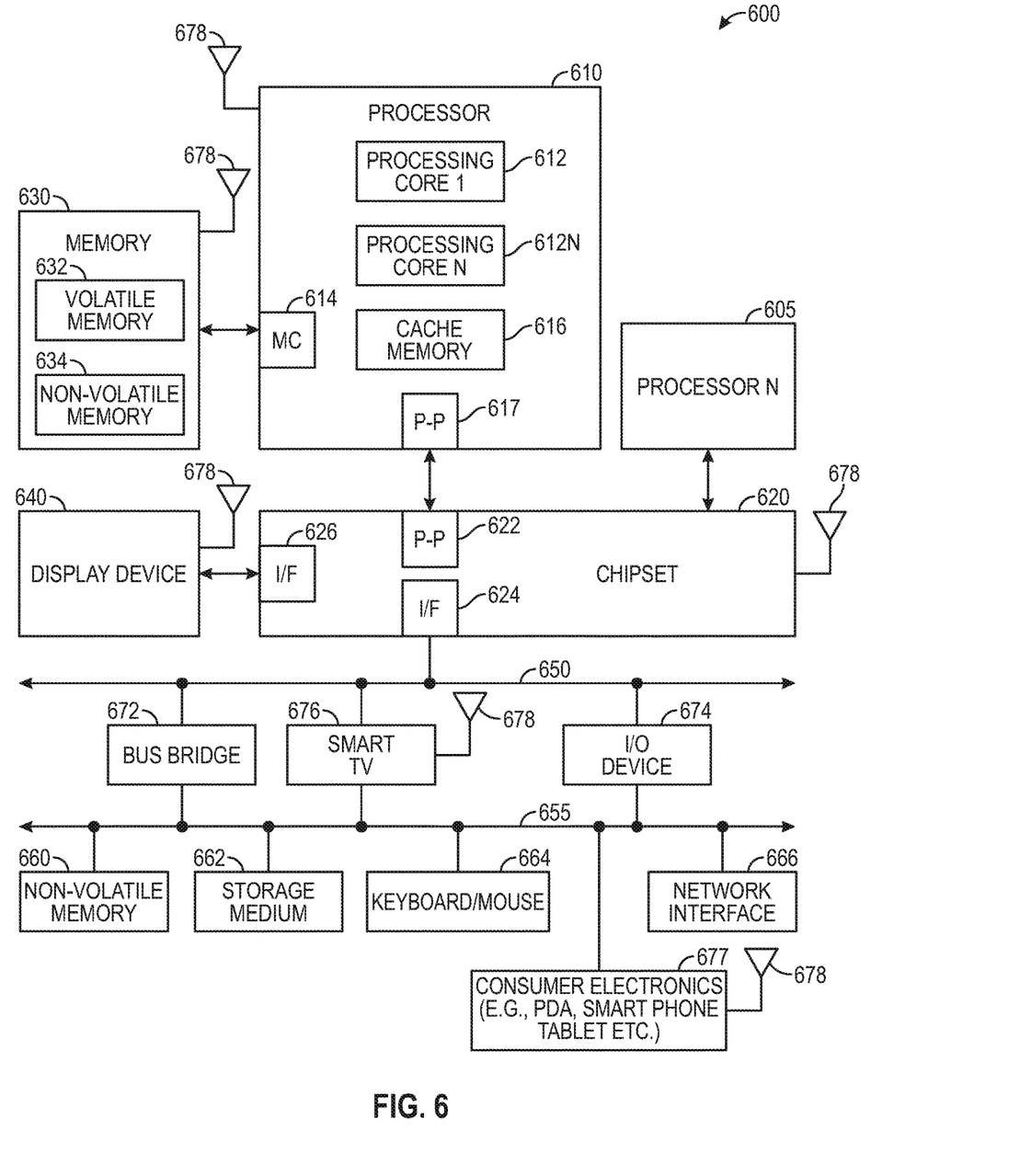
FIG. 6 is a system level diagram of a system that can include a semiconductor package assembly, in accordance with various examples.

Semiconductor package 10 can be incorporated into many different electronic devices. As shown in FIG. 2, a bridge, or other EMIB technology, may be incorporated into package 10. In another example, a bridge or other EMIB technology may be incorporated into a multi-chip module as illustrated in FIG. 1. FIG. 6 illustrates a system level diagram, according to an example of the invention that incorporates one or more packages with one or more bridges as described in examples above. For instance, FIG. 6 depicts an example of an electronic device (e.g., system) including IC package assembly 600; FIG. 6 is included to show an example of a higher level device application for the present inventive subject matter. In an example, system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some examples, system 600 is a system on a chip (SOC) system.

In an example, processor 610 has one or more processing cores 612 and 612N, where 612N represents the Nth processor core inside processor 610 where N is a positive integer. In an example, system 600 includes multiple processors including 610 and 605, where processor 605 has logic similar or identical to the logic of processor 610. In some examples, processing core 612 includes, but is not limited to, pre-fetch logic to fetch instructions, decode logic to decode the instructions, execution logic to execute instructions, and the like. In some examples, processor 610 has a cache memory 616 to cache instructions and/or data for system 600. Cache memory 616 may be organized into a hierarchal structure including one or more levels of cache memory.

In some examples, processor 610 includes a memory controller 614, which is operable to perform functions that enable the processor 610 to access and communicate with memory 630 that includes a volatile memory 632 and/or a non-volatile memory 634. In some examples, processor 610 is coupled with memory 630 and chipset 620. Processor 610 may also be coupled to a wireless antenna 678 to communicate with any device configured to transmit and/or receive wireless signals. In an example, the wireless antenna 678 operates in accordance with, but is not limited to, the IEEE 802.11 standard and its related family, Home Plug AV (HPAV), Ultra Wide Band (UWB), Bluetooth, WiMax, or any form of wireless communication protocol.

In some examples, volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 634 includes, but is not limited to, flash memory, phase change memory (PCM), read-only memory (ROM), electrically erasable programmable read-only memory (EEPROM), or any other type of non-volatile memory device.

Memory 630 stores information and instructions to be executed by processor 610. In an example, memory 630 may also store temporary variables or other intermediate information while processor 610 is executing instructions. In the illustrated example, chipset 620 connects with processor 610 via Point-to-Point (PtP or P-P) interfaces 617 and 622.

Chipset 620 enables processor 610 to connect to other elements in system 600. In some examples of the invention, interfaces 617 and 622 operate in accordance with a PtP communication protocol such as the Intel® QuickPath Interconnect (QPI) or the like. In other examples, a different interconnect may be used.

In some examples, chipset 620 is operable to communicate with processor 610, 605N, display device 640, and other devices 672, 676, 674, 660, 662, 664, 666, 677, etc. Chipset 620 may also be coupled to a wireless antenna 678 to communicate with any device configured to transmit and/or receive wireless signals.

Chipset 620 connects to display device 640 via interface 626. Display device 640 may be, for example, a liquid crystal display (LCD), a plasma display, cathode ray tube (CRT) display, or any other form of visual display device. In some examples of the invention, processor 610 and chipset 620 are merged into a single SOC. In addition, chipset 620 connects to one or more buses 650 and 655 that interconnect various elements 674, 660, 662, 664, and 666. Buses 650 and 655 may be interconnected together via a bus bridge 672. In an example, chipset 620 couples with a non-volatile memory 660, a mass storage device(s) 662, a keyboard/mouse 664, and a network interface 666 via interface 624 and/or 626, smart TV 676, consumer electronics 677, etc.

In an example, mass storage device 662 includes, but is not limited to, a solid state drive, a hard disk drive, a universal serial bus flash memory drive, or any other form of computer data storage medium. In an example, network interface 666 is implemented by any, type of well known network interface standard including, but not limited to, an Ethernet interface, a universal serial bus (USB) interface, a Peripheral Component Interconnect (PCI) Express interface, a wireless interface and/or any other suitable type of interface. In an example, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of cache memory 616) may be incorporated into processing core 612.

EXEMPLARY EXAMPLES

The following exemplary examples are provided, the numbering of which is not to be construed as designating levels of importance:

Example 1 provides a semiconductor patch comprising:
  a glass core having first and second opposed major surfaces extending in an x-y direction;
  a conductive via extending from the first major surface to the second major surface substantially in a z-direction;
  a bridge die embedded in a dielectric material in communication with the conductive via; and
  an overmold at least partially encasing the glass core.

Example 2 provides the semiconductor patch of Example 1, wherein the glass core comprises a soda-lime glass, borosilicate glass, alumino-silicate glass, alkali-borosilicate glass, aluminoborosilcate glass, an alkalialuminosilicate glass, or a mixture thereof.

Example 3 provides the semiconductor patch of any one of Example 1 or 2, wherein the glass core comprises a monolithic glass core or a laminate glass core.

Example 4 provides the semiconductor patch of any one of Example 1-3, wherein the Coefficient of Thermal Expansion (CTE) of the glass core is in a range of from about 3 to about 12.

Example 5 provides the semiconductor patch of any one of Example 1-4, wherein a thickness of the glass core, measured in the z-direction, is in a range of from about 300 microns to about 700 microns.

Example 6 provides the semiconductor patch of any one of Example 1-5, wherein the through via extends past the first major surface, the second major surface or both.

Example 7 provides the semiconductor patch of any one of Example 1-6, wherein the through via is substantially flush with the overmold.

Example 8 provides the semiconductor patch of any one of Example 1-7, wherein the first major surface, the second major surface, or both are substantially planar.

Example 9 provides the semiconductor patch of any one of Example 1-8, wherein the through via comprises a conducting material.

Example 10 provides the semiconductor patch of Example 9, wherein the conducting material comprises copper.

Example 11 provides the semiconductor patch of any one of Example 1-10, wherein the through via comprises a polygonal profile or a substantially circular profile.

Example 12 provides the semiconductor patch of Example 11, wherein the substantially circular profile is substantially circular or substantially elliptical Example 13 provides the semiconductor patch of Example 11, wherein the polygonal profile is substantially tetrahedral, substantially pentagonal, substantially hexagonal, or substantially heptagonal.

Example 14 provides the semiconductor patch of any one of Example 1-13, wherein the through via is tapered in the z-direction.

Example 15 provides the semiconductor patch of any one of Example 1-14, wherein the through via has a substantially constant cross-sectional shape in the z-direction.

Example 16 provides the semiconductor patch of any one of Example 1-15, further comprising a solder ball attached to the through via.

Example 17 provides the semiconductor patch of any one of Example 1-16, wherein the through via is a first through via and semiconductor patch further comprises a second through via.

Example 18 provides the semiconductor patch of any one of Example 1-17, wherein the overmold fully encases the glass core.

Example 19 provides the semiconductor patch of any one of Example 1-18, wherein the overmold comprises a dielectric material.

Example 20 provides the semiconductor patch of Example 19, wherein the dielectric material comprises an organic based build up film, glass-reinforced epoxy, polytetrafluorethylene, cotton-paper reinforced epoxy, phenolic-glass, paper-phenolic, polyester-glass, epoxy mold compounds or a mixture thereof.

Example 21 provides the semiconductor patch of any one of Example 19 or 20, further comprising a bridge die embedded in the dielectric material and in electrical communication with the through via.

Example 22 provides a semiconductor package comprising:
a semiconductor patch, the patch comprising:
a glass core having first and second opposed major surfaces extending in an x-y direction;
a conductive via extending from the first major surface to the second major surface substantially in a z-direction; and
a bridge die in electrical communication with the conductive via;
a substrate having third and fourth opposed major surfaces extending in the x-y direction and electronically coupled to the through via;
a first electronic component electronically coupled to the bridge die;
a second electronic component electronically coupled to the bridge die; and
an overmold at least partially encasing the glass core, the first electronic component, second electronic component, and the bridge die.

Example 23 provides the semiconductor package of Example 22, further comprising a power source coupled to the through via.

Example 24 provides the semiconductor package of any one of Example 22 or 23, wherein the glass core comprises a soda-lime glass, borosilicate glass, alumino-silicate glass, alkali-borosilicate glass, aluminoborosilcate glass, an alkalialuminosilicate glass, or a mixture thereof.

Example 25 provides the semiconductor package of any one of Example 22-24, wherein the glass core comprises a monolithic glass core or a laminate glass core.

Example 26 provides the semiconductor package of any one of Example 22-25, wherein the Coefficient of Thermal Expansion (CTE) of the glass core is in a range of from about 3 to about 12.

Example 27 provides the semiconductor package of any one of Example 22-26, wherein a thickness of the glass core, measured in the z-direction, is in a range of from about 300 microns to about 700 microns.

Example 28 provides the semiconductor package of any one of Example 22-27, wherein the through via extends past the first major surface, the second major surface or both.

Example 29 provides the semiconductor package of any one of Example 22-28, wherein the first major surface, the second major surface, or both are substantially planar.

Example 30 provides the semiconductor package of any one of Example 22-29, wherein the through via comprises a conducting material.

Example 31 provides the semiconductor package of Example 30 wherein the conducting material comprises copper.

Example 32 provides the semiconductor package of any one of Example 22-31, wherein the through via comprises a polygonal profile or a substantially circular profile.

Example 33 provides the semiconductor package of Example 32, wherein the substantially circular profile is substantially circular or substantially elliptical Example 34 provides the semiconductor package of Example 32, wherein the polygonal profile is substantially tetrahedral, substantially pentagonal, substantially hexagonal, or substantially heptagonal.

Example 35 provides the semiconductor package of any one of Example 22-35, wherein the through via is tapered in the z-direction.

Example 36 provides the semiconductor package of any one of Example 22-35, wherein the through via has a substantially constant cross-sectional shape in the z-direction.

Example 37 provides the semiconductor package of any one of Example 22-36, further comprising a solder ball attached to the through via.

Example 38 provides the semiconductor package of any one of Example 22-37, wherein the through via is a first through via and semiconductor patch further comprises a second through via.

Example 39 provides the semiconductor package of any one of Example 22-38, wherein the overmold fully encases the glass core.

Example 40 provides the semiconductor package of any one of Example 22-39, wherein the overmold comprises a dielectric material.

Example 41 provides the semiconductor package of Example 44, wherein the dielectric material comprises an organic based build up film, glass-reinforced epoxy, polytetrafluorethylene, cotton-paper reinforced epoxy, phenolic-glass, paper-phenolic, polyester-glass, Epoxy mold compound or a mixture thereof.

Example 42 provides the semiconductor package of any one of Example 22-41, wherein the substrate comprises an organic based build up film.

Example 43 provides the semiconductor package of any one of Example 22-42, wherein the first and second electronic components independently comprise a multi-die component package, a silicon die, a resistor, a capacitor, or an inductor.

Example 44 provides the semiconductor package of Example 43, wherein the multi-die component package is a NAND memory stack.

Example 45 provides the semiconductor package of any one of Example 43 or 44, wherein the silicon die comprises a central processing unit, a flash memory, a wireless charger, a power management integrated circuit (MMIC), a Wi-Fi transmitter, a global positioning system, an application specific integrated circuit, or a NAND memory stack.

Example 46 provides the semiconductor package of any one of Example 22-45, wherein a thickness of the substrate is substantially constant in the x-y direction.

Example 47 provides the semiconductor package of any one of Example 22-46, wherein a thickness of the embedded die is substantially constant in the x-y direction.

Example 48 provides a method of forming a semiconductor patch, the method comprising:
  contacting a glass core extending in an x-y direction with a seed layer, the seed layer comprising an electrically conductive material;
  growing a through via in a z-direction from the seed layer; and
  at least partially encasing the glass core in an overmold material.

Example 49 provides the method of forming the semiconductor patch of Example 48, the method further comprising positioning a bridge die in electrical contact with the through via.

Example 50 provides the method of forming the semiconductor patch of any one of Example 48 or 49, wherein the glass core comprises a soda-lime glass, borosilicate glass, alumino-silicate glass, alkali-borosilicate glass, alumino-borosilcate glass, an alkalialuminosilicate glass, or a mixture thereof.

Example 51 provides the method of forming the semiconductor patch of any one of Example 48-50, wherein the glass core comprises a monolithic glass core or a laminate glass core.

Example 52 provides the method of forming the semiconductor patch of any one of Example 52-51, wherein the Coefficient of Thermal Expansion (CTE) of the glass core is in a range of from about 3 to about 12.

Example 53 provides the method of forming the semiconductor patch of any one of Example 52-52, wherein a thickness of the glass core, measured in the z-direction, is in a range of from about 300 to about 700 microns.

Example 54 provides the method of forming the semiconductor patch of any one of Example 48-53, wherein the through via extends past the first major surface, the second major surface or both.

Example 55 provides the method of forming the semiconductor patch of any one of Example 48-54, wherein the through via is substantially flush with the overmold.

Example 56 provides the method of forming the semiconductor patch of any one of Example 48-55, wherein the first major surface, the second major surface, or both are substantially planar.

Example 57 provides the method of forming the semiconductor patch of any one of Example 48-56, wherein the through via comprises a conducting material.

Example 58 provides the method of forming the semiconductor patch of Example 57, wherein the conducting material comprises copper.

Example 59 provides the method of forming the semiconductor patch of any one of Example 48-58, wherein the through via comprises a polygonal profile or a substantially circular profile.

Example 60 provides the method of forming the semiconductor patch of Example 59, wherein the substantially circular profile is substantially circular or substantially elliptical.

Example 61 provides the method of forming the semiconductor patch of Example 59, wherein the polygonal profile is substantially tetrahedral, substantially pentagonal, substantially hexagonal, or substantially heptagonal.

Example 62 provides the method of forming the semiconductor patch of any one of Example 48-61, wherein the through via is tapered in the z-direction.

Example 63 provides the method of forming the semiconductor patch of any one of Example 48-62, wherein the through via has a substantially constant cross-sectional shape in the z-direction.

Example 64 provides the method of forming the semiconductor patch of any one of Example 48-63, further comprising a through via attached to the through via.

Example 65 provides the method of forming the semiconductor patch of any one of Example 48-64, wherein the through via is a first through via and semiconductor patch further comprises a second through via.

Example 66 provides the method of forming the semiconductor patch of any one of Example 48-65, wherein the overmold fully encases the glass core.

Example 67 provides the method of forming the semiconductor patch of any one of Example 48-66, wherein the overmold comprises a dielectric material.

Example 68 provides the method of forming the semiconductor patch of Example 67, wherein the dielectric material comprises an organic based build up film, glass-reinforced epoxy, polytetrafluorethylene, cotton-paper reinforced epoxy, phenolic-glass, paper-phenolic, polyester-glass, epoxy mold compound or a mixture thereof.

Example 69 provides the method of forming the semiconductor patch of any one of Example 67 or 68, further comprising embedding a bridge die in the dielectric material and in electrical communication with the through via.

Example 70 provides a method of forming a semiconductor package of any one of Example 48-69, the method comprising:
- growing a plurality of through vias extending in a z-direction from a substrate having opposed substantially planar major surfaces extending in an x-y direction;
- contacting the substrate with a semiconductor patch comprising:
  - a glass core having first and second opposed major surfaces extending in an x-y direction; and
  - a conductive via extending from the first major surface to the second major surface substantially in a z-direction;
- contacting a first and second electronic component with the bridge die; and
- at least partially encapsulating the semiconductor package with an overmold.

Example 71 provides the method of forming the semiconductor package of Example 70, further comprising a power source coupled to the through via.

Example 72 provides the method of forming the semiconductor package of any one of Example 70 or 71, wherein the glass core comprises a soda-lime glass, borosilicate glass, alumino-silicate glass, alkali-borosilicate glass, aluminoborosilcate glass, an alkalialuminosilicate glass, or a mixture thereof.

Example 73 provides the method of forming the semiconductor package of any one of Example 70-72, wherein the glass core comprises a monolithic glass core or a laminate glass core.

Example 74 provides the method of forming the semiconductor package of any one of Example 76-79, wherein the Coefficient of Thermal Expansion (CTE) of the glass core is in a range of from about 3 to about 12.

Example 75 provides the method of forming the semiconductor package of any one of Example 76-81, wherein a thickness of the glass core, measured in the z-direction, is in a range of from about 300 to about 700 microns.

Example 76 provides the method of forming the semiconductor package of any one of Example 70-75, wherein the through via extends past the first major surface, the second major surface or both.

Example 77 provides the method of forming the semiconductor package of any one of Example 70-76, wherein the through via is substantially flush with the overmold.

Example 78 provides the method of forming the semiconductor package of any one of Example 70-77, wherein the first major surface, the second major surface, or both are substantially planar.

Example 79 provides the method of forming the semiconductor package of any one of Example 70-78, wherein the through via comprises a conducting material.

Example 80 provides the method of forming the semiconductor package of Example 79, wherein the conducting material comprises copper.

Example 81 provides the method of forming the semiconductor package of any one of Example 70-80, wherein the through via comprises a polygonal profile or a substantially circular profile.

Example 82 provides the method of forming the semiconductor package of Example 81, wherein the substantially circular profile is substantially circular or substantially elliptical Example 83 provides the method of forming the semiconductor package of Example 81, wherein the polygonal profile is substantially tetrahedral, substantially pentagonal, substantially hexagonal, or substantially heptagonal.

Example 84 provides the method of forming the semiconductor package of any one of Example 70-83, wherein the through via is tapered in the z-direction.

Example 85 provides the method of forming the semiconductor package of any one of Example 70-84, wherein the through via has a substantially constant cross-sectional shape in the z-direction.

Example 86 provides the method of forming the semiconductor package of any, one of Example 70-85, further comprising a through via attached to the through via.

Example 87 provides the method of forming the semiconductor package of any one of Example 70-86, wherein the through via is a first through via and semiconductor patch further comprises a second through via.

Example 88 provides the method of forming the semiconductor package of any one of Example 70-88, wherein the overmold fully encases the glass core.

Example 89 provides the method of forming the semiconductor package of any one of Example 70-88 wherein the overmold comprises a dielectric material.

Example 90 provides the method of forming the semiconductor package of Example 89, wherein the dielectric material comprises an organic based build up film, glass-reinforced epoxy, polytetrafluorethylene, cotton-paper reinforced epoxy, phenolic-glass, paper-phenolic, polyester-glass, epoxy mold compound or a mixture thereof.

Example 91 provides the method of forming the semiconductor package of any one of Example 70-90, wherein the substrate comprises conducing layers dispersed within silicon.

Example 92 provides the method of forming the semiconductor package of any one of Example 70-91, wherein the first and second electronic components independently comprise a multi-die component package, a silicon die, a resistor, a capacitor, or an inductor.

Example 93 provides the method of forming the semiconductor package of Example 92, wherein the multi-die component package is a NAND memory stack.

Example 94 provides the method of forming the semiconductor package of any one of Example 92-93, wherein the silicon die comprises a central processing unit, a flash memory, a wireless charger, a power management integrated circuit (PMIC), a Wi-Fi transmitter, a global positioning system, an application specific integrated circuit, or a NAND memory stack.

Example 95 provides the method of forming the semiconductor package of any one of Example 70-94, wherein a thickness of the substrate is substantially constant in the x-y direction.

Example 96 provides the method of forming the semiconductor package of any one of Example 70-95, wherein a thickness of the embedded die is substantially constant in the x-y direction.

What is claimed is:
1. A semiconductor package, comprising:
  a package substrate;
  a glass core;
  an insulator material at least partially encasing the glass core, wherein, along a direction perpendicular to a first surface of the glass core, a portion of the insulator material is between the glass core and the package substrate, and wherein a first surface of the package substrate is closer to the first surface of the glass core than a second surface of the package substrate;

a conductive via extending between the first surface of the glass core and a second surface of the glass core substantially in the direction perpendicular to the first surface of the glass core;

a bridge die in a recess in the package substrate and electrically coupled with the conductive via; and an electronic component coupled to an end of the conductive via at the second surface of the package substrate.

2. The semiconductor package of claim 1, wherein the glass core comprises a soda-lime glass, borosilicate glass, alumino-silicate glass, alkali-borosilicate glass, alumino-borosilcate glass, an alkalialuminosilicate glass, or a mixture thereof.

3. The semiconductor package of claim 1, wherein the glass core comprises a monolithic glass core or a laminate glass core.

4. The semiconductor package of claim 1, wherein a Coefficient of Thermal Expansion (CTE) of the glass core is between about 3 and about 12.

5. The semiconductor package of claim 1, wherein the conductive via comprises a conductive material.

6. The semiconductor package of claim 1, further comprising a solder ball at the second surface of the package substrate, and an interconnect electrically connected to the solder ball and to the electronic component, wherein the solder ball is in conductive contact with the end of the conductive via at the second surface of the package substrate.

7. The semiconductor package of claim 6, wherein the interconnect is a via.

8. The semiconductor package of claim 1, wherein a first surface of the bridge die is closer to the glass core than a second surface of the bridge die, the semiconductor package further includes a solder ball at the second surface of the bridge die and an interconnect electrically connected to the solder ball and to the electronic component, and the solder ball is in conductive contact with a conductive pathway in the bridge die.

9. The semiconductor package of claim 1, wherein the package substrate includes a dielectric material, and the conductive via extends through the dielectric material.

10. The semiconductor package of claim 9, wherein the dielectric material is in contact with the portion of the insulator material between the glass core and the package substrate.

11. The semiconductor package of claim 9, wherein the dielectric material includes at least one of an organic based build up film, glass-reinforced epoxy, polytetrafluoroethylene, cotton-paper reinforced epoxy, phenolic-glass, paper-phenolic, polyester-glass, or an epoxy mold compound.

12. The semiconductor package of claim 1, wherein a thickness of the glass core is greater than 1.2 millimeters.

13. A method of forming a semiconductor package, the method comprising:

providing a package substrate;

providing a glass core;

providing an insulator material at least partially encasing the glass core, wherein, along a direction perpendicular to a first surface of the glass core, a portion of the insulator material is between the glass core and the package substrate, and wherein a first surface of the package substrate is closer to the first surface of the glass core than a second surface of the package substrate;

providing a conductive via extending between the first surface of the glass core and a second surface of the glass core substantially in the direction perpendicular to the first surface of the glass core;

providing a bridge die in a recess in the package substrate and electrically coupled with the conductive via; and providing an electronic component coupled to an end of the conductive via at the second surface of the package substrate.

14. The method of claim 13, further comprising:

providing a solder ball at the second surface of the package substrate; and providing an interconnect electrically connected to the solder ball and to the electronic component, wherein the solder ball is in conductive contact with the end of the conductive via at the second surface of the package substrate.

15. The method of claim 13, wherein the glass core comprises a soda-lime glass, borosilicate glass, alumino-silicate glass, alkali-borosilicate glass, aluminoborosilcate glass, an alkalialuminosilicate glass, or a mixture thereof.

16. A semiconductor package, comprising:

a package substrate having a first surface and a second surface, opposite the first surface;

a bridge die in a cavity in the second surface of the package substrate;

a further die above the package substrate;

one or more electrically conductive interconnects between the bridge die and the further die;

a glass core having a through-opening between a first surface of the glass core and a second surface of the glass core, wherein the first surface of the glass core is closer to the package substrate than the second surface of the glass core; and a conductive via extending between the second surface of the glass core and the second surface of the package substrate, wherein a first portion of the conductive via extends through the through-opening of the glass core and a second portion of the conductive via extends through the package substrate.

17. The semiconductor package of claim 16, further comprising a dielectric material at least partially enclosing the glass core, wherein a portion of the dielectric material is between the glass core and the package substrate, and a third portion of the conductive via extends through the dielectric material.

18. The semiconductor package of claim 17, wherein, along a direction perpendicular to the first surface of the glass core, the third portion is between the first portion and the second portion.

19. The semiconductor package of claim 17, wherein the dielectric material fully encloses the glass core.

20. The semiconductor package of claim 16, wherein a thickness of the glass core is greater than 1.2 millimeters.

* * * * *

UNITED STATES PATENT AND TRADEMARK OFFICE
CERTIFICATE OF CORRECTION

| | |
|---|---|
| PATENT NO. | : 11,901,248 B2 |
| APPLICATION NO. | : 16/832851 |
| DATED | : February 13, 2024 |
| INVENTOR(S) | : Robert L. Sankman et al. |

It is certified that error appears in the above-identified patent and that said Letters Patent is hereby corrected as shown below:

In the Claims

In Column 15, Claim 2, Lines 12-13, delete "aluminoborosilcate" and insert -- aluminoborosilicate --, therefor.

In Column 15, Claim 8, Line 36, delete "an interconnect" and insert -- the interconnect --, therefor.

In Column 16, Claim 15, Line 25, delete "aluminoborosilcate" and insert -- aluminoborosilicate --, therefor.

Signed and Sealed this
Nineteenth Day of March, 2024

Katherine Kelly Vidal
*Director of the United States Patent and Trademark Office*